United States Patent
Liu et al.

(10) Patent No.: US 7,365,422 B2
(45) Date of Patent: Apr. 29, 2008

(54) PACKAGE OF LEADFRAME WITH HEATSINKS

(75) Inventors: Pai-Chou Liu, Kaoshiung (TW); Jun-Cheng Liu, Kaoshiung (TW); Kenneth Kinhang Ku, Kaoshiung (TW); Yu-Li Chung, Kaoshiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 146 days.

(21) Appl. No.: 11/312,461

(22) Filed: Dec. 21, 2005

(65) Prior Publication Data

US 2007/0069345 A1    Mar. 29, 2007

(30) Foreign Application Priority Data

Sep. 29, 2005 (TW) .............................. 94134061 A

(51) Int. Cl.
*H01L 23/10* (2006.01)
*H05K 7/20* (2006.01)

(52) U.S. Cl. ..................... 257/706; 257/707; 257/711; 257/712; 257/713; 257/717; 257/720; 257/796; 257/E33.075; 257/E23.051; 257/E23.08; 257/E23.102; 257/E23.103; 257/E23.105; 361/697; 361/702; 361/709; 361/711

(58) Field of Classification Search ................ 257/276, 257/625, 675, 700–722, 796, E33.075, E31.131, 257/E23.051, E23.08–E23.113; 438/122, 438/FOR. 413; 361/696, 697, 701–703, 361/709–711
See application file for complete search history.

(56) References Cited

U.S. PATENT DOCUMENTS 5,629,561 A    5/1997  Shin et al.
2005/0139974 A1 *  6/2005  Huang et al. ................ 257/678

* cited by examiner

*Primary Examiner*—Jasmine Clark
(74) *Attorney, Agent, or Firm*—Volentine & Whitt, P.L.L.C.

(57) ABSTRACT

A package of a leadframe with heatsinks, including a leadframe, a die, a first heatsink and a second heatsink. The leadframe has a die pad and a plurality of leads, and the leads are disposed around the die pad. The die is disposed on the die pad. The first heatsink is disposed on a first side of the leadframe and has a plurality of first positioning portions. The second heatsink is disposed on a second side of the leadframe. The second heatsink has a plurality of second positioning portions. The second positioning portions correspond to the first positioning portions of the first heatsink, whereby the warping problem of the leadframe is resolved.

9 Claims, 5 Drawing Sheets

PACKAGE OF LEADFRAME WITH HEATSINKS

BACKGROUND OF THE INVENTION

1. Field of the Invention

The invention relates to a package, particularly to a package of leadframe with heatsinks.

2. Description of the Related Art

FIG. 1A shows a conventional package of a leadframe with heatsinks. The conventional package 1 comprises a first heatsink 11, a die 12, a leadframe 14, a second heatsink 10 and encapsulating material 17. The first heatsink 11 is disposed on the leadframe 14 and is attached to the leadframe 14 by using a first electrical insulating material 15. Also, part of the first heatsink 11 is exposed out of the conventional package 1.

The die 12 attaches to the second heatsink 10 and electrically connects to the leadframe 14 with a plurality of wires. The leadframe 14 is disposed under the first heatsink 11. The second heatsink 10 is disposed under the die 12 and the leadframe 14. The leadframe 14 is attached to the second heatsink 10 by using a second electrical insulating material 16. Also, part of the second heatsink 10 is exposed out of the conventional package 1. The encapsulating material 17 is used to encapsulate the first heatsink 11, the die 12, the leadframe 14 and the second heatsink 10 to form the conventional package 1.

FIG. 1B shows the conventional first heatsink 11. FIG. 1C shows the conventional leadframe 14. The first heatsink 11 has a plurality of heat bars 113. The Ieadframe 14 has a plurality of leads 141, and the leads are provided with the first electrical insulating material 15 to attach to the heat bars 113. Referring to FIG. 1A again, because the first heatsink 11 and the second heatsink 10 do not have positioning portions, the forces on the leadframe 14 are unbalanced. Therefore, the conventional package 1 has shortcomings, for example, the problem of leadframe 14 warping.

Consequently, there is an existing need for a package of a leadframe with heatsinks to solve the above-mentioned problem.

SUMMARY OF THE INVENTION

One objective of the present invention is to provide a package of leadframe with heatsinks. Because the first heatsink and the second heatsink of the conventional package do not have positioning portions, the forces on the leadframe are unbalanced. There is problem of leadframe warping. Therefore, the package of leadframe with heatsinks of the present invention can be used to improve such problem of leadframe warping.

The package of leadframe with heatsinks comprises a leadframe, a die, a first heatsink and a second heatsink. The leadframe has a die pad and a plurality of leads, and the leads are disposed around the die pad. The die is disposed on the die pad. The first heatsink is disposed on a first side of the leadframe and has a plurality of first positioning portions. The second heatsink is disposed on a second side of the leadframe. The second heatsink has a plurality of second positioning portions. The second positioning portions are corresponding to the first positioning portions of the first heatsink.

DETAILED DESCRIPTION OF THE INVENTION

Figure 1A:
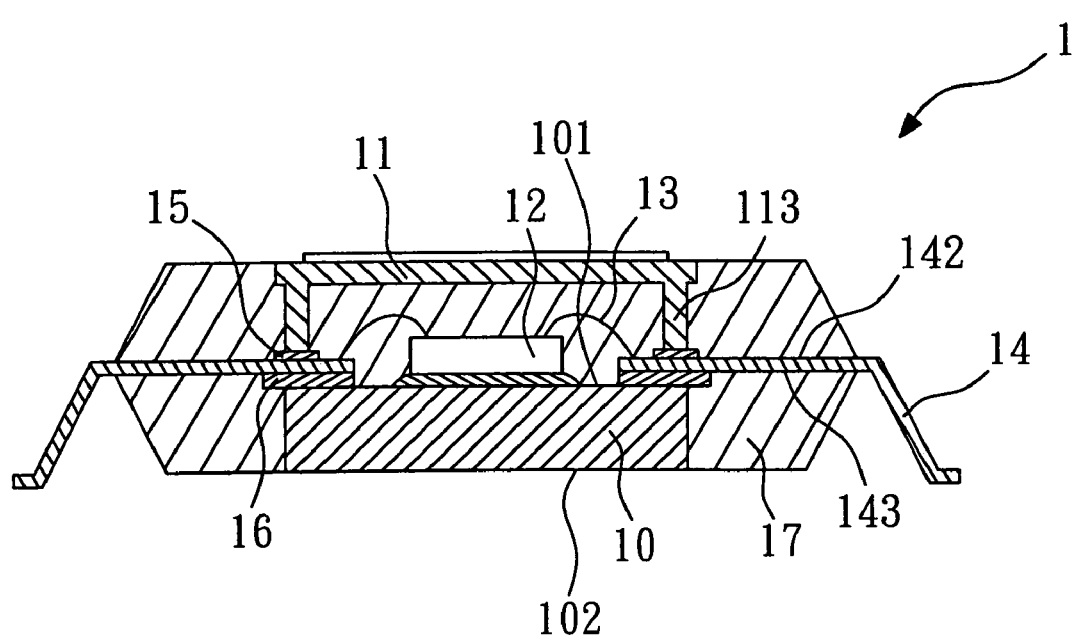
FIG. 1A shows a conventional package of leadframe with heatsinks.
Figure 1B:
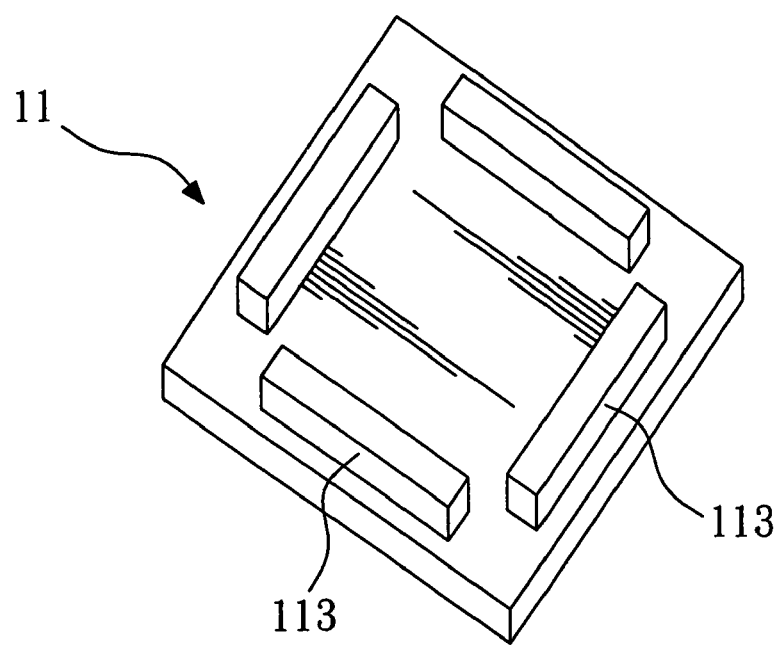
FIG. 1B shows a conventional first heatsink.
Figure 1C:
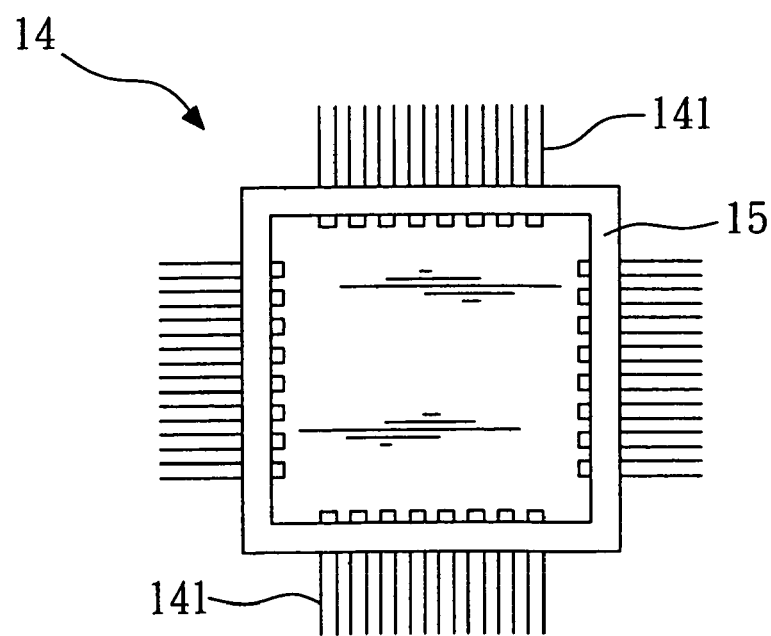
FIG. 1C shows a conventional leadframe.
Figure 2A:
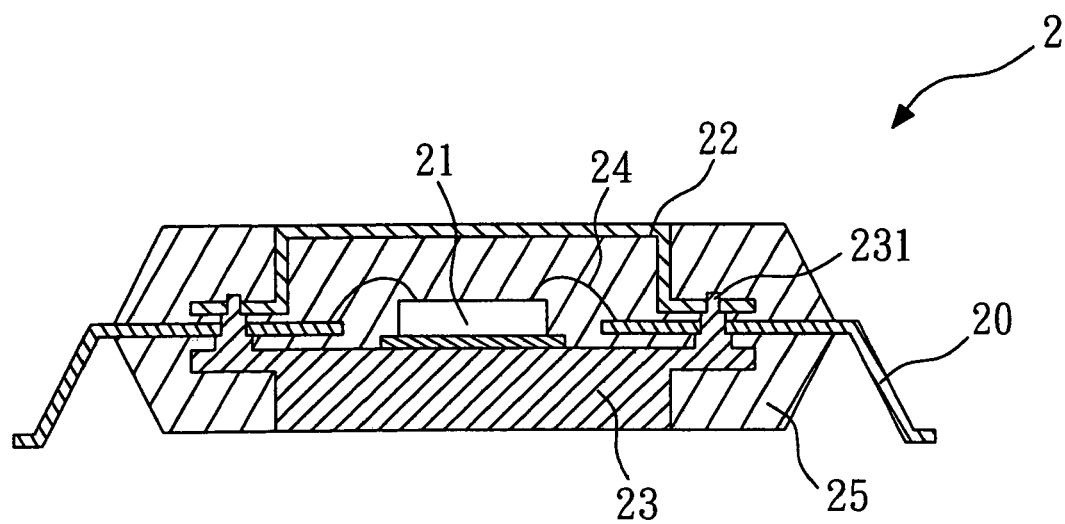
FIG. 2A shows a package of leadframe with heatsinks according to a first embodiment of the present invention.

Referring to FIG. 2A, it shows a package of a leadframe with heatsinks according to a first embodiment of the present invention. The package 2 comprises a leadframe 20, a die 21, a first heatsink 22, a second heatsink 23 and encapsulating material 25. The first heatsink 22 is disposed on the leadframe 20. The die 21 is disposed on the leadframe 20 and electrically connects to the leadframe 20 with a plurality of wires 24.

One side of the first heatsink 22 is stair shaped, and it can also be multi-stair shaped, and part of the first heatsink 22 is exposed out of the package 2 to facilitate the heat dissipation. The second heatsink 23 is disposed under the leadframe 20. Part of the second heatsink 23 is exposed out of the package 2, and the heat dissipates out from the second heatsink 23. The encapsulating material 25 is-used to encapsulate the leadframe 20, the die 21, the first heatsink 22, and the second heatsink 23 to form the package 2.

Figure 2B:
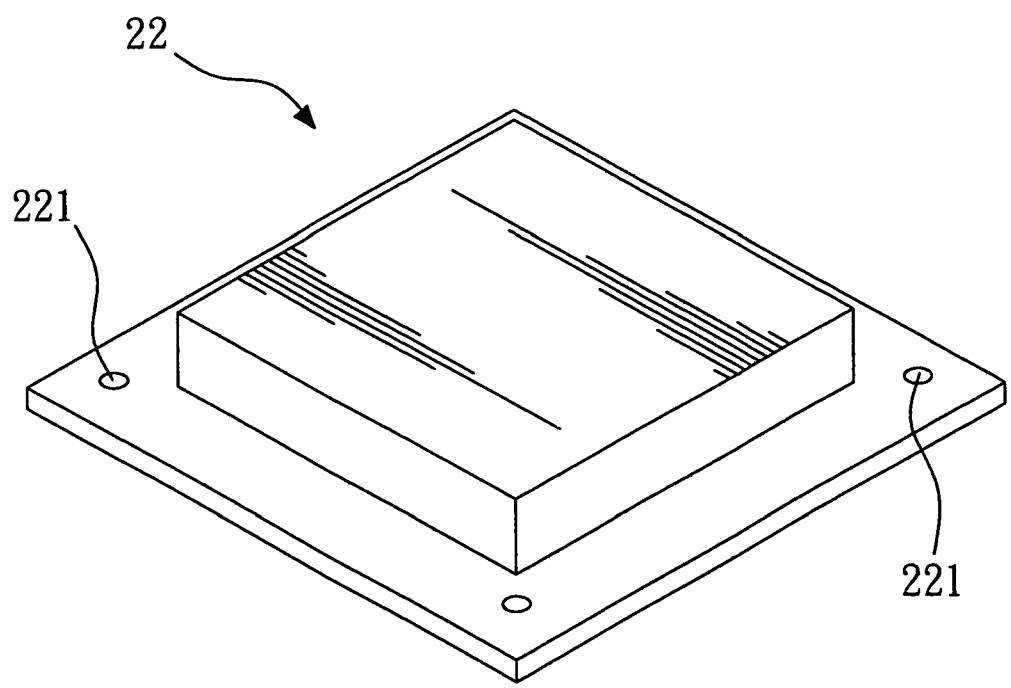
FIG. 2B shows a first heatsink of the present invention.
Figure 2C:
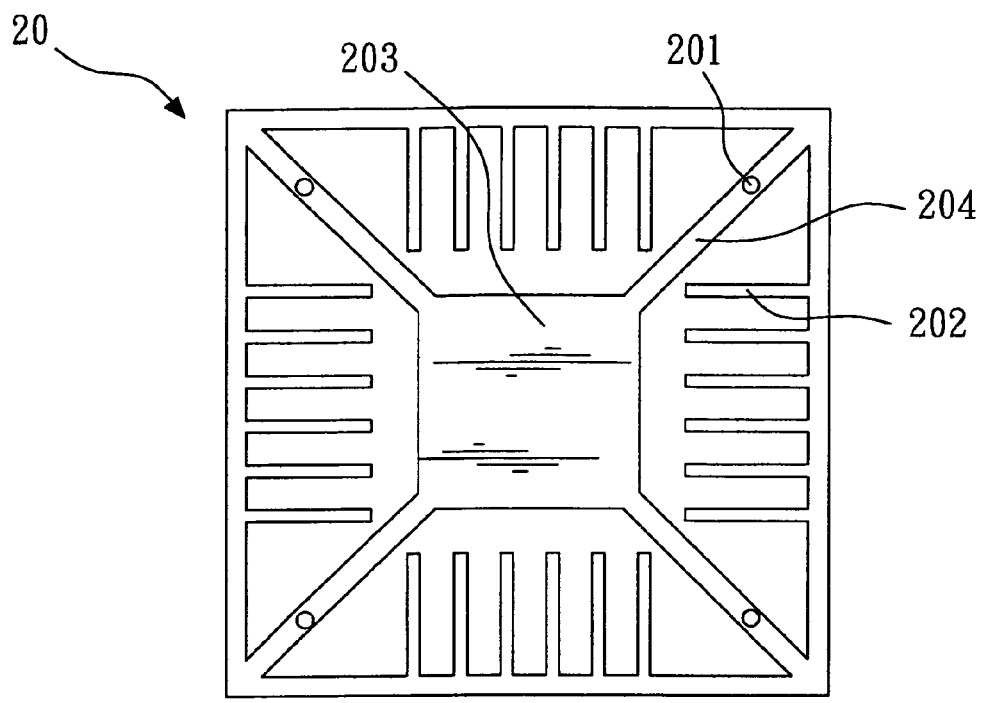
FIG. 2C shows a leadframe of the present invention.

Referring to FIG. 2B, it shows the first healsink 22 of the present invention. The first heatsink 22 has a plurality of first positioning portions 221 and the first positioning portions are openings. Referring to FIG. 2C, it shows the leadframe of the present invention. The leadframe 20 has a die pad 203 and a plurality of leads 202, and the leads 202 are disposed around the die pad 203. The leadframe 20 has a plurality of third positioning portions 201. The third positioning portions 201 are openings and disposed on tie bars 204 of the leadframe 20.

Figure 2D:
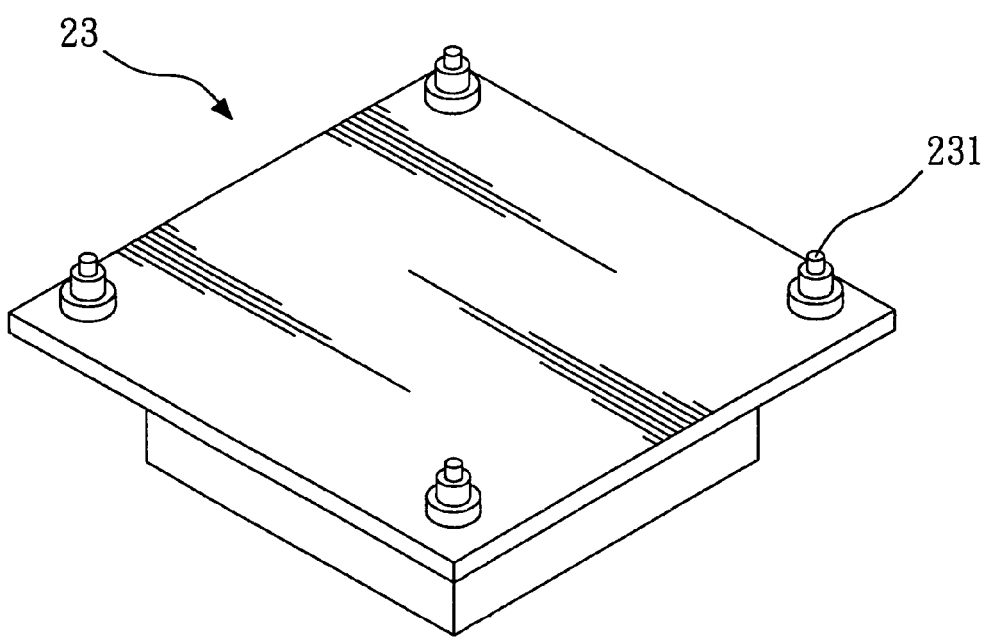
FIG. 2D shows a second heatsink of the present invention.

Referring to FIG. 2D, it shows the second heatsink 23 of the present invention. The second heatsink 23 is disposed at the back surface of the die pad 203, and there is a heat conducting material disposed between the second heatsink 23 and the die pad 203 to improve the heat dissipation. In addition, the second heatsink 23 has a plurality of second positioning portions 231, and the second positioning portions 231 are protrusions. The second positioning portions 231 are disposed correspondingly to the first positioning portions 221 of the first heatsink 22, and the second positioning portions 231 are stair shaped.

Referring to FIG. 2A again, the second positioning portions 231 penetrate through the corresponding first positioning portions 221 and the corresponding third positioning portions 201 so that the first heatsink 22 and the second heatsink 23 are at different positions to avoid the leads 202 of the leadframe 20 forming a short circuit. The second positioning portions 231 can penetrate through the corresponding first positioning portions 221 but do not penetrate through the corresponding third positioning portions 201, and thus the first heatsink 22 combines with the second heatsink 23.

In the first embodiment, the second positioning portions 231 penetrate through the corresponding first positioning portions 221 and the corresponding third positioning portions 201, so that the first heatsink 22 combines with the second heatsink 23 so as to improve the problem of leadframe warping.

Figure 3:
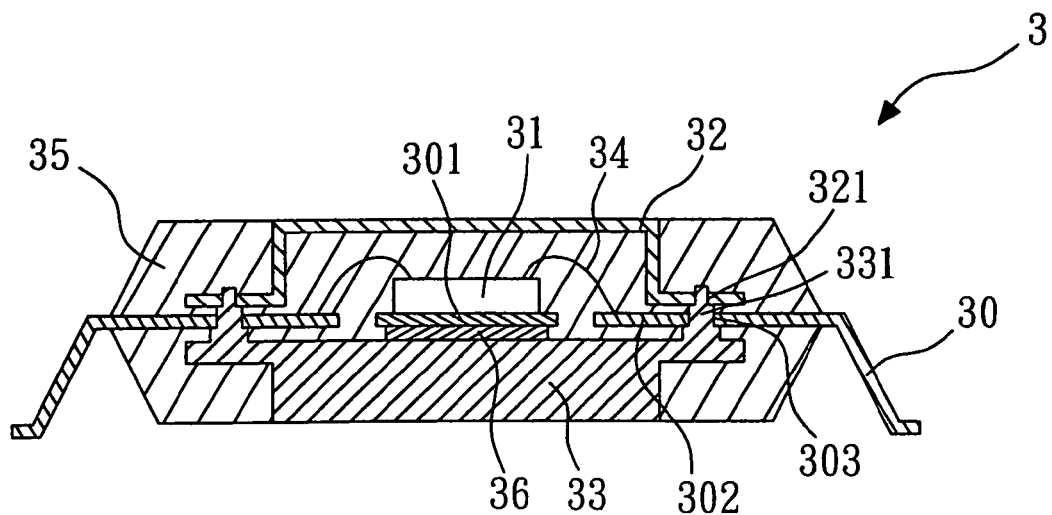
FIG. 3 shows a package of leadframe with heatsinks according to a second embodiment of the present invention.

FIG. 3 shows a package of leadframe with heatsinks according to a second embodiment of the present invention. The structure of the package 3 is similar to the structure of the package 2 in the first embodiment. The package 3 comprises a leadframe 30, a die 31, a first heatsink 32, a second heatsink 33 and encapsulating material 35. The difference between the first embodiment and the second embodiment is that the die pad 301 of the leadframe 30 and the leads 302 are on the same level. Also, there is a non-electrical insulating material 36 between the die pad 301 and the second heatsink 33 to efficiently conduct the heat to the second heatsink 33.

In the second embodiment, the second positioning portions 331 penetrate also through the corresponding first positioning portions 321 of the first heatsink 32 and the corresponding third positioning portions 303 of the leadframe 30, so that the first heatsink 32 combines with the second heatsink 33 so as to improve the problem of leadframe warping.

Figure 4:
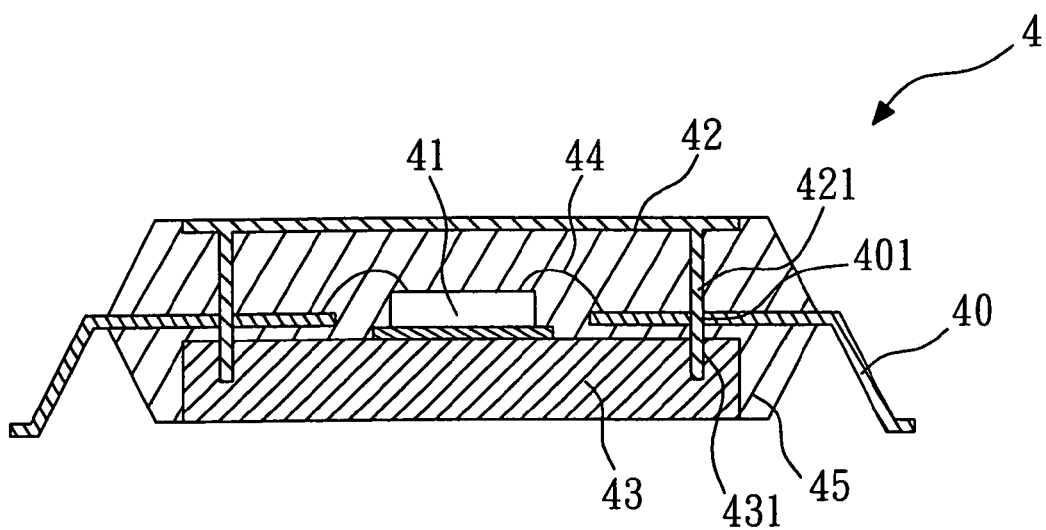
FIG. 4 shows a package of leadframe with heatsinks according to a third embodiment of the present invention.

FIG. 4 shows a package of a leadframe with heatsinks according to a third embodiment of the present invention. The structure of the package 4 is similar to the structure of the package 2 in the first embodiment. The package 4 comprises a leadframe 40, a die 41, a first heatsink 42, a second heatsink 43 and encapsulating material 45. The difference between the first embodiment and the third embodiment is that the first positioning portions 421 of the first heatsink 42 are protrusions and the second positioning portions 431 of the second heatsink 43 are slots. By utilizing the connection of the first positioning portions 421 and the second positioning portions 431, the first heatsink 42 combines with the second heatsink 43.

In the third embodiment, the first positioning portions 421 penetrate through the corresponding third positioning portions 401 of the leadframe 40 and the corresponding second positioning portions 431 of the second heatsink 43, so that the first heatsink 42 combines with the second heatsink 43 so as to improve the problem of leadframe warping.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A package of leadframe with heatsinks comprising:
   a leadframe, having a die pad and a plurality of leads, and the leads disposed around the die pad;
   a die, disposed on the die pad;
   a first heatsink, disposed on a first side of the leadframe and having a plurality of first positioning portions; and
   a second heatsink, disposed on a second side of the leadframe and having a plurality of second positioning portions, the second positioning portions disposed correspondingly to the first positioning portions of the first heatsink.

2. The package according to claim 1, wherein the first heatsink has a stair-shaped side.

3. The package according to claim 1, wherein the first positioning portions are first openings, and the second positioning portions are protrusions.

4. The package according to claim 1, wherein the second positioning portions are stair-shaped.

5. The package according to claim 1, wherein the leadframe has a plurality of third positioning portions.

6. The package according to claim 1, wherein the second heatsink is disposed at the back surface of the die pad.

7. The package according to claim 1, further comprising a heat-conducting material disposed between the second heatsink and the die pad.

8. The package according to claim 5, wherein the third positioning portions are second openings.

9. The package according to claim 5, wherein the leadframe further comprises a plurality of tie bars, and the third positioning portions are disposed at the tie bars.

* * * * *